United States Patent
Quintarelli et al.

(10) Patent No.: US 10,788,036 B2
(45) Date of Patent: Sep. 29, 2020

(54) PERISTALTIC PUMP

(71) Applicant: SEKO S.P.A., Cittaducale (IT)

(72) Inventors: Mauro Quintarelli, Cittaducale (IT); Luigino Esposito, Cittaducale (IT)

(73) Assignee: SEKO S.P.A., Cittaducale (IT)

(*) Notice: Subject to any disclaimer, the term of this patent is extended or adjusted under 35 U.S.C. 154(b) by 260 days.

(21) Appl. No.: 15/535,562

(22) PCT Filed: Jan. 7, 2016

(86) PCT No.: PCT/IB2016/050058
§ 371 (c)(1),
(2) Date: Jun. 13, 2017

(87) PCT Pub. No.: WO2016/110813
PCT Pub. Date: Jul. 14, 2016

(65) Prior Publication Data
US 2017/0350389 A1    Dec. 7, 2017

(30) Foreign Application Priority Data

Jan. 8, 2015  (IT) ............................. RM2015A0007

(51) Int. Cl.
*F04B 53/22* (2006.01)
*F04B 43/12* (2006.01)
(Continued)

(52) U.S. Cl.
CPC .......... *F04B 53/22* (2013.01); *F04B 43/1253* (2013.01); *F04B 49/065* (2013.01);
(Continued)

(58) Field of Classification Search
CPC ................ F04B 43/1253; F04B 53/22; H05K 2201/09009; H05K 2201/09; H05K 2201/09027; F04D 13/0686; F04D 25/068
See application file for complete search history.

(56) References Cited

U.S. PATENT DOCUMENTS 4,313,150 A  *  1/1982  Chu .................... H05K 7/1409
                                                                  361/755
2007/0148010 A1    6/2007  Michels et al.
(Continued)

FOREIGN PATENT DOCUMENTS

DE        3108129 A1    9/1982
EP        0881389 A1   12/1998
EP        2098729 A1    9/2009

*Primary Examiner* — Philip E Stimpert
(74) *Attorney, Agent, or Firm* — Jacob M. Ward; Ward Law Office LLC

(57) ABSTRACT

Peristaltic pump comprising un housing (100), containing an electric motor (130), and a head (200) configured to be coupled to the housing (100), the head (200) housing a tube comprising two accessible ends and a rotor provided with two or more squeezing elements configured to squeeze the tube, the rotor being configured to be driven by the electric motor (130) when the head (200) is coupled to the housing (100), wherein the housing (100) further contains a printed circuit board (160) configured to control the peristaltic pump and to supply power to the electric motor (130), the printed circuit board (160) being provided with two slots (161), configured to house two power supply terminals (131) of the electric motor (130) insertable into the two slots (161), and with two or more protruding male blade terminals (162), configured to be connected to external female blade terminals of an external power supply, the printed circuit board (160) being substantially triangular and configured to be obtained from a pair of printed circuit boards (160) identical to each other obtainable by separating two antisymmetric portions of a rectangular board (900) along a section line (930) that is antisymmetric with respect to or coincident with a diagonal of the rectangular board (900).

10 Claims, 10 Drawing Sheets

(51) Int. Cl.

| | |
|---|---|
| *H02K 11/33* | (2016.01) |
| *F04B 49/06* | (2006.01) |
| *F04B 49/20* | (2006.01) |
| *H01R 12/71* | (2011.01) |
| *H02K 7/116* | (2006.01) |
| *H05K 1/11* | (2006.01) |
| *H05K 5/00* | (2006.01) |
| *H05K 3/32* | (2006.01) |
| *H05K 1/18* | (2006.01) |

(52) U.S. Cl.
CPC ........... *F04B 49/20* (2013.01); *H01R 12/718* (2013.01); *H02K 7/116* (2013.01); *H02K 11/33* (2016.01); *H05K 1/11* (2013.01); *H05K 5/006* (2013.01); *H05K 1/181* (2013.01); *H05K 3/325* (2013.01); *H05K 2201/09027* (2013.01); *H05K 2201/1009* (2013.01)

(56) References Cited

U.S. PATENT DOCUMENTS

| | | | |
|---|---|---|---|
| 2008/0168651 A1 | 7/2008 | Bhatt et al. | |
| 2008/0301933 A1 | 12/2008 | Miller et al. | |
| 2009/0140585 A1* | 6/2009 | Pant | H02K 5/225 310/71 |
| 2010/0117468 A1* | 5/2010 | Kurita | F04D 19/002 310/71 |
| 2010/0129248 A1 | 5/2010 | Mou | |
| 2011/0215115 A1* | 9/2011 | Proper | B67D 7/76 222/173 |
| 2013/0154411 A1* | 6/2013 | Mawhinney | H02K 5/145 310/72 |
| 2013/0234567 A1 | 9/2013 | Weber et al. | |
| 2013/0251561 A1 | 9/2013 | Ramirez, Jr. et al. | |
| 2014/0010675 A1* | 1/2014 | Kent | F04B 43/009 417/53 |

* cited by examiner

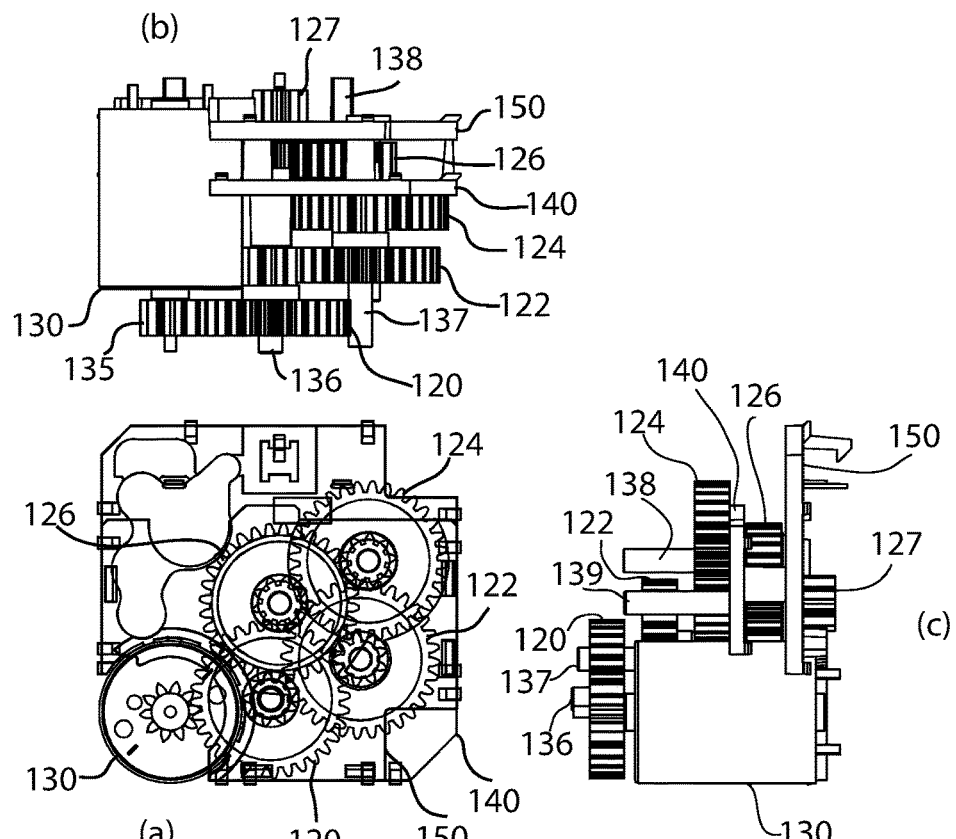
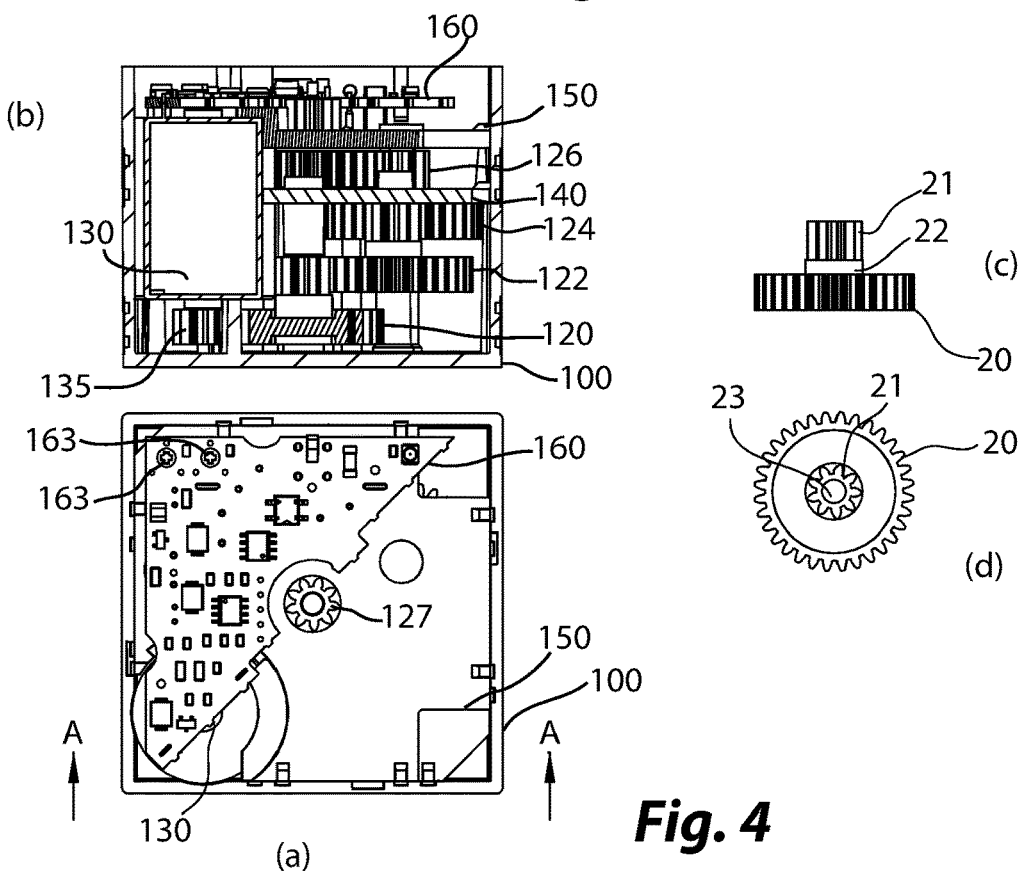
Fig. 3
Fig. 4

PERISTALTIC PUMP

CROSS-REFERENCE TO RELATED APPLICATIONS

This patent application is a National Stage of International Application No. PCT/IB2016/050058, filed Jan. 7, 2016, which claims priority to the Italian Patent Application No. RM2015A000007, filed Jan. 8, 2015. The entire disclosures of the above patent applications are hereby incorporated herein by reference.

FIELD

The present invention concerns a peristaltic pump, in particular a dosing pump, provided with an electronic board made in a simple, reliable, efficient and inexpensive way, consequently reducing the cost of the peristaltic pump. Moreover, the arrangement of the electronic components allows to simplify the assembling, installation and maintenance operations, at the same time reducing their costs.

BACKGROUND

In the following of the present description reference will be mainly made to peristaltic dosing pumps. However, it must be noted that the peristaltic pump according to the invention may be also different from a dosing pump and used in any hydraulic circuit for applications different from mixing, such as for instance dispensing of beverages or syrups, still remaining within the scope of protection of the present invention.

Moreover, in the following reference will be made to a peristaltic pump having a specific shape devoid of projections on the side walls, that is compact and applicable to a wide variety of different structures, wherein the electronic and mechanical components (e.g. an electronic board and a reduction gear) are coupled inside the pump through snap-fits. However, it must be noted that the peristaltic pump according to the invention may also have different shapes and arrangements of coupling of the electronic and mechanical components different from snap-fit connection means, still remaining within the scope of protection of the present invention.

It is known that mixing apparatuses are widespread. In particular, in the field of cleaning and disinfection of surfaces, such apparatuses allow both water-only treatment and addition of concentrated chemicals, such as for instance disinfectants, soaps, wet foams and dry foams. Such apparatuses comprise dosing pumps which contribute to mixing of the various substances with water and to dispensing the obtained mixture according to accurate dosages.

A commonly used type of dosing pump is the peristaltic pump, thanks to its generally simple operation that allows an accurate dosage. As known, a peristaltic pump comprises (at least) one tube that is squeezed by two or more rollers (or similar elements) with which a rotor set in rotation by an electric motor is provided; the ends of the tube are connected to a first and second ducts, each one of which is advantageously provided with a respective joint, and both the first and the second ducts may alternatively operate as inlet duct and as outlet duct, depending on the direction of rotation of the rotor. When the duct operating as inlet duct is connected to a fluid source (for instance a hydraulic supply or a tank), thanks to the pressure variations created in the various portions of the tube separated by the squeezing rollers, the fluid is aspirated in the tube and is dispensed from the duct operating as outlet duct.

Some prior art peristaltic pumps are disclosed in documents US 2007/0148010 A1, EP 2098729 A1, US 2010/0129248 A1, US 2013/0251561 A1.

However, the prior art peristaltic pumps suffer from some drawbacks.

In particular, the electronic components have complex arrangements which increase their manufacture costs.

SUMMARY

Therefore, it is an object of the present invention to allow in a simple, reliable, efficient and inexpensive way to implement the electronic control of a peristaltic pump, in particular a dosing pump.

It is another object of the present invention to make assembling and installation and maintenance interventions simple and fast and, consequently, inexpensive.

It is specific subject matter of the present invention a peristaltic pump, in particular a dosing pump, comprising un housing, containing an electric motor, and a head configured to be coupled to the housing, the head housing a tube comprising two accessible ends and a rotor provided with two or more squeezing elements configured to squeeze the tube, the rotor being configured to be driven by the electric motor when the head is coupled to the housing, wherein the housing further contains a printed circuit board configured to control the peristaltic pump and to supply power to the electric motor, the printed circuit board being provided with two slots, configured to house two power supply terminals of the electric motor insertable into the two slots, and with two or more protruding male blade terminals, configured to be connected to external female blade terminals of an external power supply, the printed circuit board being substantially triangular and configured to be obtained from a pair of printed circuit boards identical to each other obtainable by separating two antisymmetric portions of a rectangular board along a section line that is antisymmetric with respect to or coincident with a diagonal of the rectangular board.

According to another aspect of the invention, the printed circuit board may be configured to be obtained from a pair of printed circuit boards identical to each other obtainable by separating two antisymmetric portions of a square board along a section line that is antisymmetric with respect to or coincident with a diagonal of the square board.

According to a further aspect of the invention, said section line may be partially arranged on said diagonal, whereby said printed circuit board is provided with at least one pair of portions being offset from said diagonal, wherein a first portion of the pair is projecting with respect to said diagonal and a second portion of the pair is recessed with respect to said diagonal.

According to an additional aspect of the invention, said two or more protruding male blade terminals may be Faston blade terminals.

According to another aspect of the invention, the printed circuit board may be provided with one or more trimmers for adjusting the speed of the electric motor accessible from at least one slot of the head.

According to a further aspect of the invention, the printed circuit board may be provided with one or more pairs of electrical terminals configured to be connected to one or more respective trimmers for adjusting the speed of the electric motor coupled to the head and accessible from the outside.

According to an additional aspect of the invention, at least one side wall of the housing may comprise at least one notch configured to house two or more electrical terminals for supplying power to the printed circuit board.

According to another aspect of the invention, said two or more electrical terminals housed in said at least one notch may be male or female terminals, optionally Faston blade ones, configured to connect to corresponding external female or male terminals for making male-female electrical connections.

According to a further aspect of the invention, said two or more electrical terminals housed in said at least one notch may be housed in at least one duct that is in turn capable to be housed in said at least one notch.

According to an additional aspect of the invention, said at least one duct may be hinged within said at least one notch.

According to another aspect of the invention, the printed circuit board may be coupled to the housing through snap-fit connection means.

According to a further aspect of the invention, said snap-fit connection means may comprise snap-fit teeth with which the printed circuit board is provided which are configured to insert into corresponding slots of at least two side walls of the housing.

According to an additional aspect of the invention, the snap-fit teeth may be configured to slide, while assembling the peristaltic pump, along corresponding alignment guides with which said at least two side walls of the housing are provided down to insert into the slots, whereby, while the teeth slide along the corresponding alignment guides, the printed circuit board and said at least two side walls of the housing to which the corresponding alignment guides belong elastically bend.

According to another aspect of the invention, the printed circuit board may be removably coupled to the housing.

The advantages offered by the peristaltic pump according to the invention are evident.

In particular, the peristaltic pump according to the invention has a control printed circuit board having a configuration such that two boards are obtainable (in an antisymmetric way) by separating two portions of a rectangular or square board along a section line, not necessarily but optionally at least partially arranged along a diagonal of the rectangle or square. This allows to minimise the cost of the control printed circuit board of the peristaltic pump.

Also, the peristaltic pump may be optionally devoid of any wiring, and the power supply of the electric motor may be advantageously made through male-female electrical connectors, optionally Faston blade connectors, wherein the peristaltic pump is provided with two or three male terminals or with two or three female terminals, optionally two female terminals, which do not protrude from the side walls of the housing of the pump. This allows to further simplify the assembling, installation and maintenance operations, at the same time reducing their costs with respect to the prior art pumps.

DESCRIPTION OF THE DRAWINGS

The present invention will be now described, by way of illustration and not by way of limitation, according to its preferred embodiments, by particularly referring to the Figures of the annexed drawings, in which:

FIG. 3 shows a top plan view (FIG. 3a, wherein lower hidden components are also shown), a front view (FIG. 3b) and a right side view (FIG. 3c) of a part of the components contained within the housing of FIG. 2;

FIG. 4 shows a first top plan view (FIG. 4a) and a section view according to the plane AA of FIG. 4a (FIG. 4b) of the housing and of a part of the components contained therein, as well as a front view (FIG. 4c) and a top plan view (FIG. 4d) of a toothed wheel of the peristaltic pump of FIG. 1;

FIG. 6 shows a perspective front section view according to the plane BB of FIG. 5 (FIG. 6a), an enlargement of a first particular (FIG. 6b) and an enlargement of a second particular (FIG. 6c) of such perspective front section view of FIG. 6a;

FIG. 8 shows a section view according to the plane CC of FIG. 7 (FIG. 8a) and an enlargement of a particular (FIG. 8b) of the section view of FIG. 8a;

DETAILED DESCRIPTION

Figure 1:
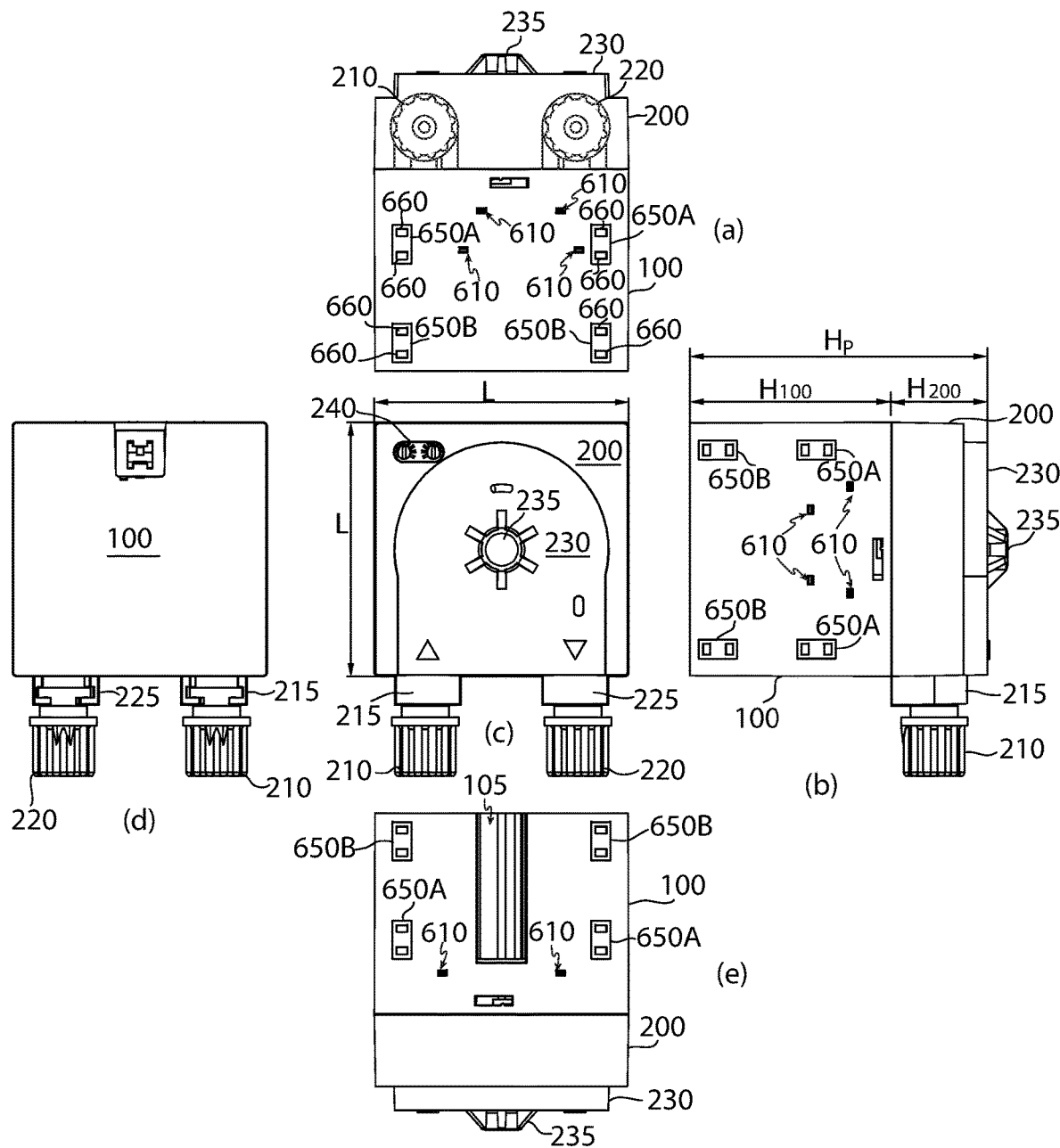
FIG. 1 shows a front view (FIG. 1a), a left side view (FIG. 1b), a top plan view (FIG. 1c), a bottom plan view (FIG. 1d) and a rear view (FIG. 1e) of a preferred embodiment of the peristaltic pump according to the invention.

In the Figures identical reference numerals will be used for alike elements.

In the following of the description, the directional terminology, such as "right", "left", "front", "rear", "base", "top", "upper", "lower", "side", etc., is used with reference to the Figures of the attached drawings. Since components and/or elements and/or embodiments of the present invention can be positioned and/or operated in several different orientations, the directional terminology is merely used by way of example and not by way of limitation.

With reference to FIG. 1, it may be observed that a preferred embodiment of the peristaltic pump according to the invention is a dosing pump having a housing 100 and a head 200 which may be removably coupled to each other. As it will be illustrated later, the housing 100 contains the electrical components, e.g. the control printed circuit board and the electric motor, and the reduction gear of the peristaltic pump; in particular, the housing 100 substantially has the shape of a rectangular parallelepiped devoid of a face (i.e., the five external surfaces of its walls, devoid of projections and possibly provided with holes and/or notches, are planar and lie on the faces of a rectangular parallelepiped—whereby each side wall is configured to rest on an external planar wall), in particular a rectangular parallelepiped close to a cubic shape, wherein the dimensions of the three sides do not differ from each other by more than 30%. In the preferred embodiment, the housing 100 has a square base having side L and height $H_{100}$, wherein the height $H_{100}$ is equal to about 80% of L:

$$H_{100}=0.8 \cdot L$$

In other words, the housing 100 substantially has the shape of a rectangular parallelepiped with square base the inside of which is accessible from the missing face of it; conventionally, in the following of the description it will be assumed that the missing wall of the housing 100 is the upper wall, whereby the housing 100 has hollow top. As shown in particular in FIG. 1e, the rear wall of the housing 100 comprises a notch 105 configured to house a duct 108 (shown in FIG. 11e, where it is shown that the duct 108 is optionally orientable since it has the upper end hinged within the notch 105) that houses two electrical terminals for supplying power to the printed circuit board contained within the housing 100; advantageously, the two electrical terminals are male terminals, optionally Faston blade ones, configured to connect with corresponding external female terminals for making male-female electrical connections. Other embodiments of the peristaltic pump according to the invention may be devoid of the duct 108 and/or comprise three (instead of two) power electrical terminals and/or terminals different from male Faston blade terminals (e.g. female Faston terminals, or male or female terminals not of Faston type).

Other embodiments of the peristaltic pump according to the invention may have other specific dimensions of the three sides of the rectangular parallelepiped shape of the housing 100 (on the faces of which the five external surfaces of its walls lie), the base of which is in general a rectangle instead a square (a square, in the context of the present description and claims, is to be construed as a particular case of rectangle); optionally, the two sides a and b of the base rectangle and the height $H_{100}=h$ of the rectangular parallelepiped differ from each other by not more than 30%, whereby such three sides satisfy one of each one of the following three pairs of inequalities:

$$\begin{cases} 0,7 \cdot b \leq a \leq 1,3 \cdot b \\ 0,7 \cdot a \leq b \leq 1,3 \cdot a \end{cases}$$

$$\begin{cases} 0,7 \cdot h \leq a \leq 1,3 \cdot h \\ 0,7 \cdot a \leq h \leq 1,3 \cdot a \end{cases}$$

$$\begin{cases} 0,7 \cdot h \leq b \leq 1,3 \cdot h \\ 0,7 \cdot b \leq h \leq 1,3 \cdot b \end{cases}$$

Figure 6:
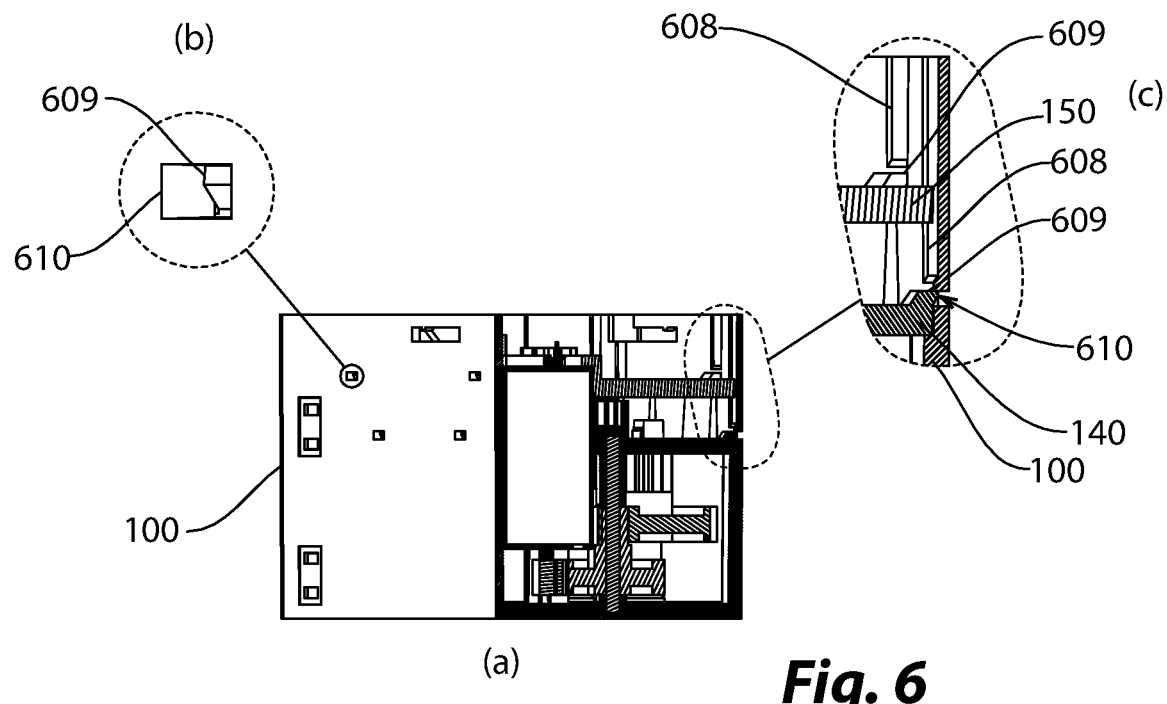
Figure 5:
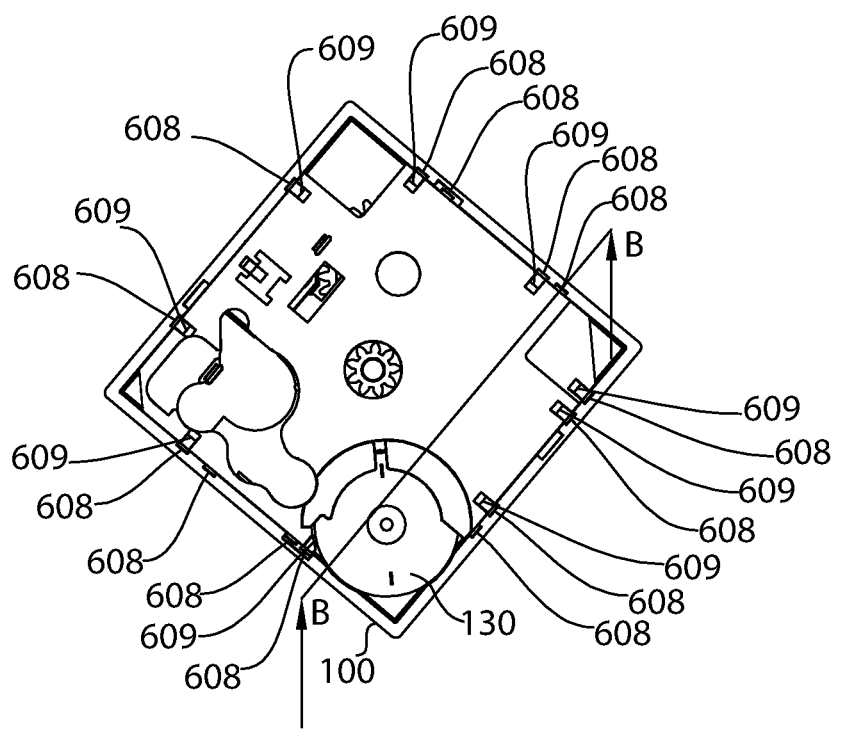
FIG. 5 shows a top plan view of the housing, and of the components contained therein, of the peristaltic pump of FIG. 1.

Slots 610 configured to allow a snap-fit connection with some plates contained in the same housing 100, as it will be better illustrated later with reference to FIGS. 5 and 6, are present on the four side walls of the housing 100.

The head 200 of the peristaltic pump houses a rotor provided with two or more (optionally two or three) rollers (or similar elements) and the tube that is squeezed by the rollers; in this regard, the rotor, the rollers and the tube are not shown in the Figures. The head 200 has a hollow base configured to be coupled to the top of the housing 100 (i.e. in correspondence of the missing upper wall of the latter), where the hollow base of the head 200 is delimited by four side walls arranged on the side faces of a rectangular parallelepiped having square base having side L (equal to the side of the square base of the housing 100). The head 200 superiorly comprises a projecting upper portion 230 in turn provided with a projection 235. The whole height $H_{200}$ of the head 200, excluding the projection 235, is equal to about 37% of the height $H_{100}$ of the housing 100:

$$H_{200}=0.37 \cdot H_{100}$$

whereby the whole height $H_P$ (excluding the projection 235) is larger than the side L of the base square of the housing 100 (and of the head 200) by about 17%, i.e.:

$$H_P=H_{100}+H_{200}=1.17 \cdot L$$

Other embodiments of the peristaltic pump according to the invention may have other specific shapes and dimensions of the head 200, that still has a hollow base configured to be coupled to the top of the housing 100 (i.e. in correspondence of the missing upper wall of the latter), wherein the head 200 is contained or inscribable in a rectangular parallelepiped having base identical to the base of the rectangular parallelepiped of the housing 100 and height $H_{200}$ optionally smaller than the height $H_{100}$ of the housing 100 and more optionally ranging from 20% to 50% of the latter:

$$0.2 \cdot H_{100} \leq H_{200} \leq 0.5 \cdot H_{100}$$

When the head 200 is coupled to the housing 100, the hub of the rotor is mechanically connected to the reduction gear housed within the housing 100 so that the rotor is set in rotation by the electric motor, also housed within the housing 100, when this is operated, whereby the rollers are set in rotation thus squeezing the tube according to a peristaltic operation. A first and a second joints 210 and 220 with which two ducts 215 and 225 are provided, each one connected to a respective end of the tube, protrude from the head 200; in particular, other embodiments of the peristaltic pump according to the invention may be devoid of the joints 210 and 220.

Moreover, the features of the shape of the peristaltic pump (in particular with reference to the housing 100 and head 200) devoid of projections on the side walls of the housing 100 are not features essential to the invention.

Furthermore, the head 200 is provided on an upper surface easily accessible with (at least) one slot 240 for accessing two adjusting electronic components, also known as trimmers, for adjusting the speed of the (electric motor and, consequently, of the) rotor of the head 200; such electronic components are on a printed circuit board housed within the housing 100, as it will be illustrated later. In particular, other embodiments of the peristaltic pump may comprise more than one slot for accessing the trimmers (which may be also in a number different from two, for instance only one trimmer or three or more trimmer) and/or one or more slots for accessing the trimmers in position different from that shown in the Figures for the preferred embodiment of the peristaltic pump according to the invention. The shape of the slot(s) for accessing the trimmers is not a feature essential to the invention.

Figure 2:
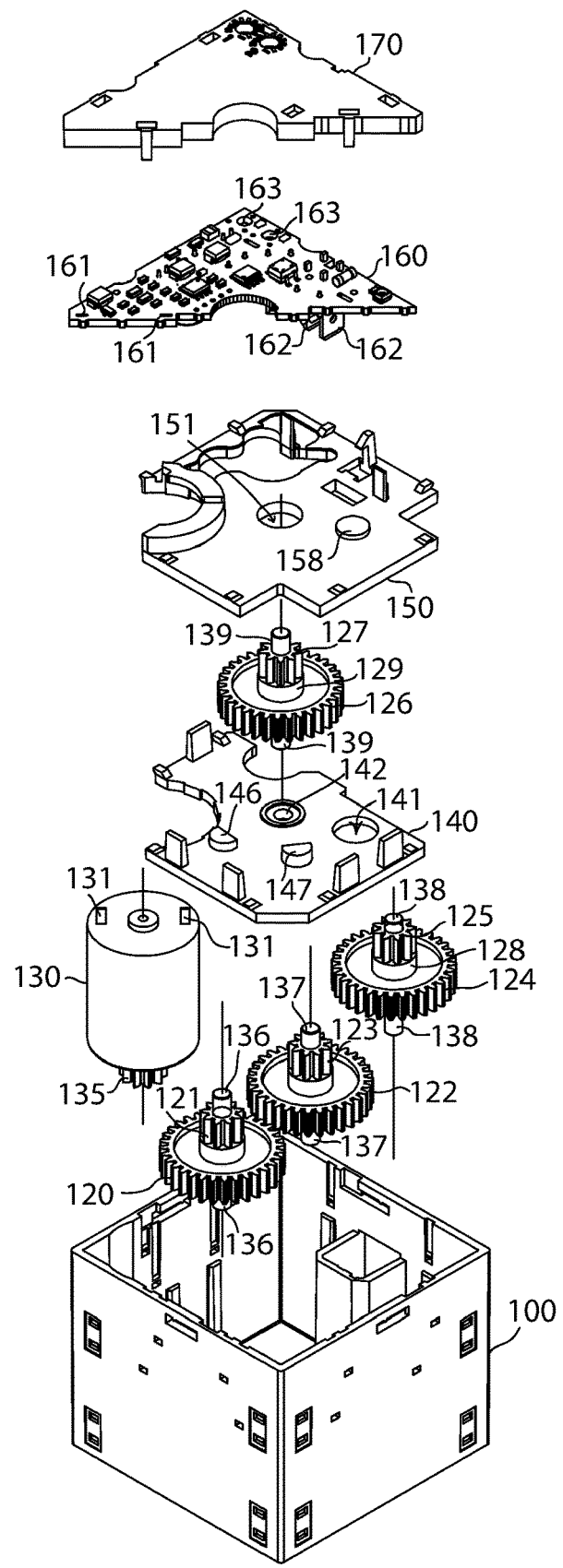
FIG. 2 shows a exploded perspective view of the housing, and of the components contained therein, of the peristaltic pump of FIG. 1.

With reference to FIGS. 2-4, it may be observed that the housing 100 contains an electric motor 130, configured to set a main pinion 135, that is inferiorly positioned (i.e. towards the base of the housing 100), in rotation, and a reduction gear comprising a first toothed wheel 120 provided with a first secondary pinion 121, a second wheel 122 provided with a second secondary pinion 123, a third wheel 124 provided with a third secondary pinion 125, and a fourth wheel 126 provided with a fourth secondary pinion 127, superiorly positioned at the centre of the hollow top of the housing 100. As shown in FIGS. 4c and 4d, the toothed wheels 120, 122, 124 and 126 of the reduction gear are all equal to the same type and size of toothed wheel 20 provided with secondary pinion 21, the base of which has a smooth collar 22, wherein the toothed wheel 20 has an axial through hole 22 in which an axis may be inserted. Other embodiments of the peristaltic pump according to the invention may comprise a reduction gear comprising two or more toothed wheels different from each other.

In particular, the main pinion 135 is configured to interact with the first toothed wheel 120, the (first) secondary pinion 121 of which is in turn configured to interact with the second toothed wheel 122, the (second) secondary pinion 123 of which is in turn configured to interact with the third toothed wheel 124, the (third) secondary pinion 125 of which is in turn configured to interact with the fourth toothed wheel 126, the (fourth) secondary pinion 127 of which is in turn configured to be mechanically connected to the hub of the rotor housed within the head 200, when the latter is coupled to the housing 100, so that the rotor is set in rotation when the electric motor is operated. Other embodiments of the peristaltic pump according to the invention may comprise a different arrangement of the reduction gear, comprising one or more toothed wheels which may be also devoid of respective secondary pinions.

The housing 100 further contains a lower alignment plate 140 and an upper alignment plate 150 configured to be snap-fit connected to the housing 100 in respective positions, so as to make the toothed wheels 120, 122, 124 and 126 of the reduction gear appropriately align, also with the aid of the internal surface of the base of the housing 100. In particular, the axis 136 of the first toothed wheel 120 has the lower end positioned in a corresponding notch (not shown) of the internal surface of the base of the housing 100 and the upper end positioned in a respective notch of the lower surface of the lower alignment plate 140 (the corresponding protrusion 146 of which is visible on the upper surface); similarly, the axis 137 of the second toothed wheel 122 has the lower end positioned in a corresponding notch (not shown) of the internal surface of the base of the housing 100 and the upper end positioned in a respective notch of the lower surface of the lower alignment plate 140 (the corresponding protrusion 147 of which is visible on the upper surface); the axis 138 of the third toothed wheel 124 has the lower end positioned in a corresponding notch of a protrusion (not shown) of the internal surface of the base of the housing 100 and the upper end positioned in a respective notch of the lower surface of the upper alignment plate 150 (the corresponding protrusion 158 of which is visible on the upper surface), whereby the third toothed wheel 124 is positioned just beneath the lower alignment plate 140 and the third secondary pinion 125 exits from a through hole 141 thereof and is positioned between the lower alignment plate 140 and the upper alignment plate 150, so that its collar 128 is configured to rotate inside the edge of the through hole 141; the axis 139 of the fourth toothed wheel 126 is inserted in a through hole 142 of the lower alignment plate 140 and has the lower end positioned in a corresponding notch (not shown) of the internal surface of the base of the housing 100 and the fourth secondary pinion 127 exits from a through hole 151 of the upper alignment plate 150, so that its collar 129 is configured to rotate inside the edge of the through hole 151, whereby the fourth toothed wheel 126 is positioned between the lower alignment plate 140 and the upper alignment plate 150.

The housing 100 also contains a printed circuit board 160 for controlling the peristaltic pump, that is provided with two slots 161, configured to house the two power supply terminals 131 of the electric motor 130 insertable into the two slots 161 (as shown in greater detail in FIG. 8), with two downwardly projecting male blade terminals 162, for connection to an external power supply (through corresponding terminals housed within the duct 108 shown in FIG. 11e), and with two trimmers 163 for adjusting the speed of the electric motor and, consequently, of the rotor of the head 200. Furthermore, the housing 100 contains a protective plate 170 (not shown in FIGS. 3 and 4), optionally made of plastics, configured to snap-fit connect on the perimeter of the board 160 so as to cover the same board 160.

With reference to FIGS. 5 and 6, it may be observed that the lower alignment plate 140 and the upper alignment plate 150, optionally made of plastics, are provided with snap-fit teeth 609 which are configured to insert into corresponding slots 610 of at least two, optionally three, more optionally four, side walls of the housing 100. In particular, while assembling the peristaltic pump, the snap-fit teeth 609 are slid along corresponding alignment guides 608, with which the side walls of the housing 100 are provided, down to insert into the slots 610; obviously, while the teeth 609 slide along the corresponding alignment guides 608, the plate to which the teeth 609 belong and the side walls of the housing 100 to which the corresponding alignment guides 608 belong elastically bend. In particular, the lower alignment plate 140 and the upper alignment plate 150 are configured to be snap-fit connected to the housing 100, in a removable or not removable manner.

In other words, the peristaltic pump according to the invention is provided with a reduction gear integrated inside the housing 100 that uses a single type of toothed wheel provided with pinion, advantageously made of plastics. All the components of the reduction gear are fixed through plates, also advantageously made of plastics, coupled to the housing 100 through snap-fits, without using any screw. Furthermore, power is supplied to the electric motor through terminals which do not create any projection nor any wiring. This allows to simplify assembling, installation and maintenance operations, at the same time reducing their costs, unlike the prior art peristaltic pumps which use commercial gear motors fixed with screws inside the casing. Moreover, the arrangement of the peristaltic pump according to the invention is compact and handy.

Moreover, the features related to the snap-fit connection (devoid of screws and similar elements, i.e. exclusively with snap-fits) of the components contained within the housing 100 and related to the reduction gear are not features essential to the invention.

Figure 8:
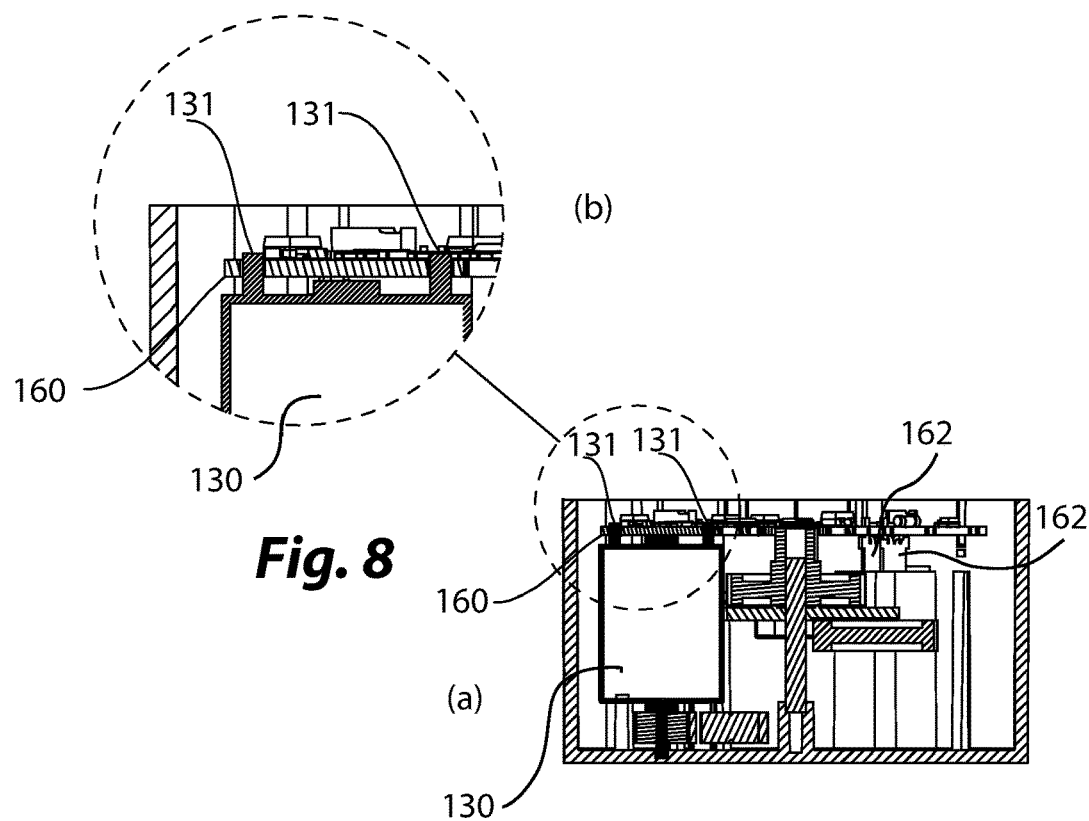
Figure 7:
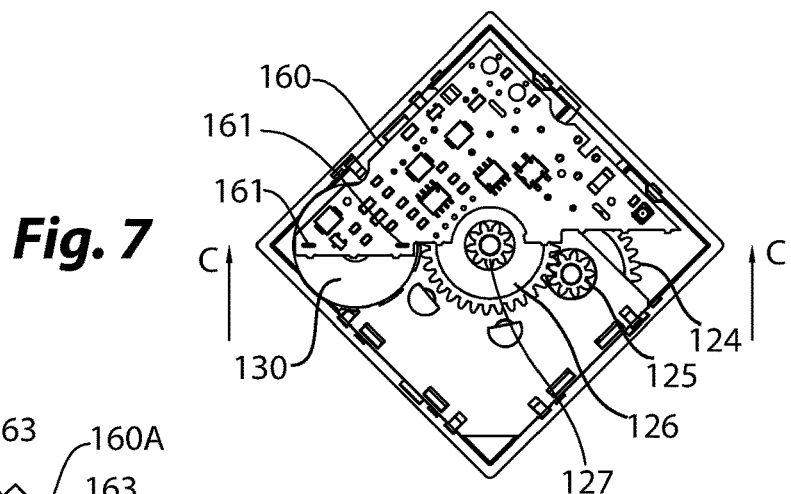
FIG. 7 shows a second top plan view of the housing, and of a part of the components contained therein, of the peristaltic pump of FIG. 1.
Figure 9:
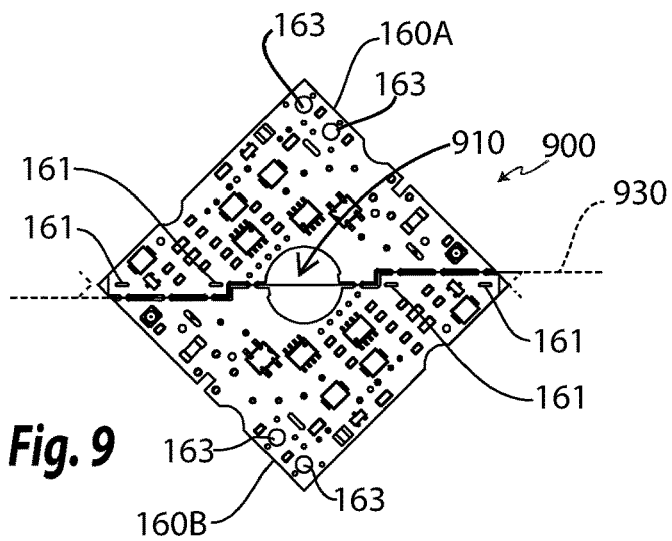
FIG. 9 shows a top plan view of a square printed circuit board for obtaining two printed circuit boards of the type used in the peristaltic pump of FIG. 1.

Making reference also to FIGS. 7 and 8 (wherein the housing 100 is shown devoid of the protective plate 170), it may be observed that the printed circuit board 160 for controlling the peristaltic pump has a shape close to the one of an equilateral right triangle. As shown in FIG. 9, this is particularly advantageous since it is possible to obtain from a square printed circuit board 900, provided with a central hole 910, it is possible to obtain two control printed circuit boards 160A and 160B usable in two peristaltic pumps according to the invention; in particular, the two boards 160A and 160B are obtainable (in an antisymmetric way) by separating the two portions of the square board 900 along a section line 930 having three portions: a central portion around the central hole 910 along a diagonal of the square board 900 and two end portions being slightly offset from said diagonal (protruding when considered with reference to the respective control printed circuit board 160A or 160B), along which diagonal the slots 161 (configured to house the power supply terminals 131 of the electric motor 130) of both boards 160A and 160B are located, whereby each control printed circuit board 160A or 160B has a portion projecting with respect to the diagonal provided with the slots 161 and a portion recessed with respect to the diagonal. This allows to minimise the cost of the control printed circuit board 160 of the peristaltic pump. Optionally, also the printed circuit board 160 for controlling the peristaltic pump snap-fit connects to the side walls of the housing 100 similarly to what illustrated with reference to the lower alignment plate 140 and upper alignment plate 150.

Other embodiments of the peristaltic pump according to the invention may have the printed circuit board having a similar configuration, wherein two boards are obtainable (in an antisymmetric way) by separating two portions of a rectangular or square board along a section line, not necessarily but optionally at least partially arranged along a diagonal of the rectangle or square, and wherein optionally the two boards are provided with at least one pair of portions being slightly offset from such diagonal, wherein a first portion of the pair is projecting with respect to the diagonal and a second portion of the pair is recessed with respect to the diagonal.

Moreover, the features related to the electronics comprising a control printed circuit board having the specific configuration illustrated with reference to FIG. 7-9 may be present in the peristaltic pump according to the invention independently from the other features, i.e. independently from the shape of the peristaltic pump (in particular with reference to the housing 100 and head 200) devoid of projections on the side walls of the housing 100, and independently from the features related to the snap-fit connection (devoid of screws and similar elements, i.e. exclusively with snap-fits) of the components contained within the housing 100 and related to the reduction gear, i.e. that the peristaltic pump is also provided with such other features related to the shape and snap-fit connection.

Figure 10:
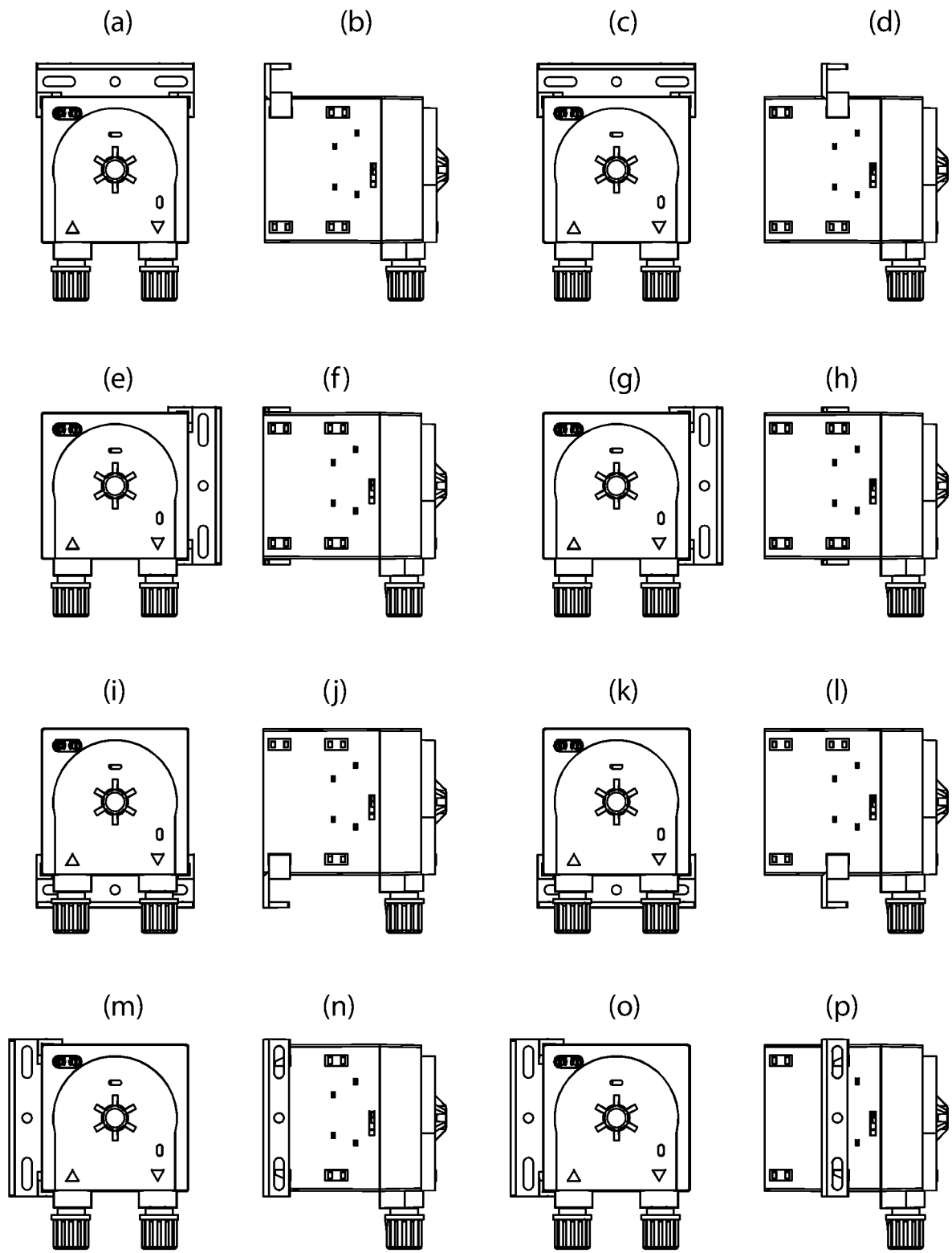
FIG. 10 shows a top plan view (FIG. 10a) and a right side view (FIG. 10b) of a first arrangement of a bracket attached to the peristaltic pump of FIG. 1, a top plan view (FIG. 10c) and a right side view (FIG. 10d) of a second arrangement of a bracket attached to the peristaltic pump of FIG. 1, a top plan view (FIG. 10e) and a right side view (FIG. 10f) of a third arrangement of a bracket attached to the peristaltic pump of FIG. 1, a top plan view (FIG. 10g) and a right side view (FIG. 10h) of a fourth arrangement of a bracket attached to the peristaltic pump of FIG. 1, a top plan view (FIG. 10i) and a right side view (FIG. 10j) of a fifth arrangement of a bracket attached to the peristaltic pump of FIG. 1, a top plan view (FIG. 10k) and a right side view (FIG. 10l) of a sixth arrangement of a bracket attached to the peristaltic pump of FIG. 1, a top plan view (FIG. 10m) and a right side view (FIG. 10n) of a seventh arrangement of a bracket attached to the peristaltic pump of FIG. 1, and a top plan view (FIG. 10o) and a right side view (FIG. 10p) of an eighth arrangement of a bracket attached to the peristaltic pump of FIG. 1.
Figure 11:
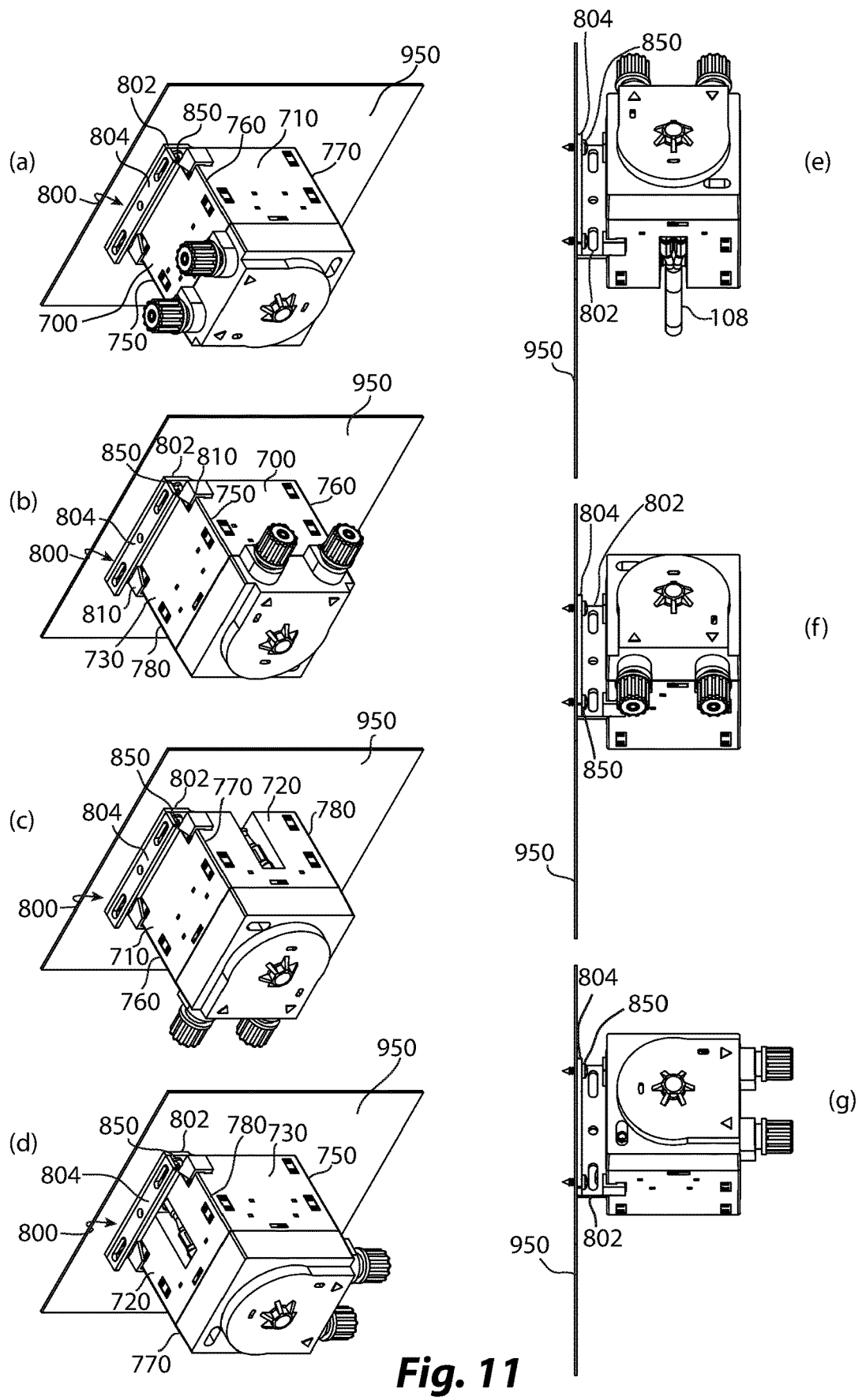
FIG. 11 shows a perspective view of the fifth arrangement of FIGS. 10i and 10j fixed to an external wall (FIG. 11a), a perspective view of the third arrangement of FIGS. 10e and 10f fixed to an external wall (FIG. 11b), a perspective view of the seventh arrangement di FIGS. 10m and 10n fixed to an external wall (FIG. 11c), a perspective view of the first arrangement di FIGS. 10a and 10b fixed to an external wall (FIG. 11d), a perspective view of the fourth arrangement di FIGS. 10g and 10h fixed to an external wall (FIG. 11e), a perspective view of the eighth arrangement di FIGS. 10o and 10p fixed to an external wall (FIG. 11f), and a perspective view of the second arrangement di FIGS. 10c and 10d fixed to an external wall (FIG. 11g)
Figure 14:
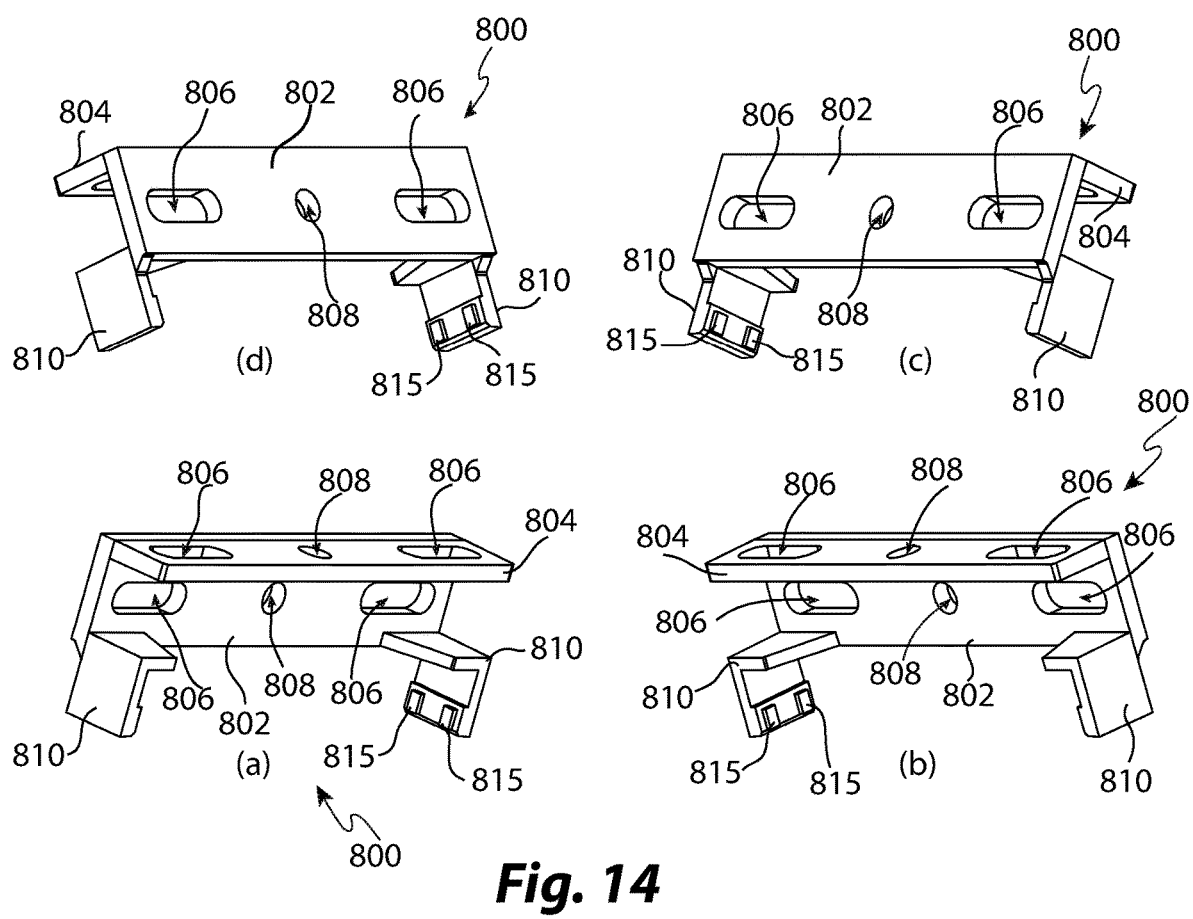
FIG. 14 shows a perspective front right view (FIG. 14a), a perspective front left view (FIG. 14b), a perspective rear right view (FIG. 14c) and a perspective rear left view (FIG. 14d) of a bracket applicable to the peristaltic pump of FIG. 1.

Making reference to FIGS. 10 and 11, it may be observed that the square base shape of the housing 100 allows to apply a single type of bracket to all the side walls of the same housing 100 at two possible heights with respect to the base of the housing 100. In fact, with reference also to FIG. 1, it may be observed that two pairs of notches are present on all the four side walls of the housing 100 at two different heights: a pair of upper notches 650A and a pair of lower notches 650B. In particular, the two upper or lower notches 650A or 650B of each pair are advantageously located in proximity of the two edges separating the side wall (to which the upper or lower notches 650A or 650B under consideration belong) from the contiguous side walls, and the upper and lower notches 650A and 650B are at the same distance from the closest edge. By way of example, with particular reference to FIG. 11b, the upper and lower notches 650A and 650B on the front wall 700 are located in proximity of the two edges 750 and 760 separating the front wall 700 from the left side wall 730 and from the right side wall 710, respectively. As particularly shown in FIG. 1, each upper and lower notch 650A and 650B on the side walls comprises a pair of holes 660 into which, as shown in detail in FIG. 14, a pair of corresponding teeth 815 are insertable, with which corresponding teeth two side engagement elements 810 are provided, having two slabs integrally coupled to each other for forming a L-profile, with which a bracket 800 is provided, which bracket comprises two orthogonal plates 802 and 804 integrally coupled to each other (whereby the bracket 800 is shaped according a L-profile) provided with slots 806 and/or through holes 808 in which screws 850 (or similar fastening means) are insertable for fixing the peristaltic pump to an external wall 950; in particular, the two side engagement elements 810 integrally coupled to the plate 802 of the bracket 800, and the axis of the junction of the two slabs of each one of the two side engagement elements 810 is orthogonal to the axis of the junction of the two plates 802 and 804. In particular, each one of the two L-shaped side engagement elements 810 of a bracket 800 comprises a pair of teeth 815 on the internal surface of the slab that is outermost with respect to the bracket 800, between the two forming the side element 810, that is orthogonal to the two plates 802 and 804, so that the two side engagement elements 810 engage with two respective pairs of upper or lower notches 650A or 650B present on the side walls of the housing 100 adjacent to the side wall on which the plate 802 rests and with respect to which side wall the other plate 804 of the bracket 800 is disposed parallel. In other words, as shown in FIGS. 10 and 11, the bracket 800 is configured to couple to the housing 100, being disposed parallel to a side wall of the housing 100, through snap-fit insertion of the pairs of teeth of the two side engagement elements 810 in two respective pairs of notches 650A or 650B present on the walls adjacent to such parallel side wall of the housing 100. In particular, the bracket 800 is configured to removably engage with the housing 100.

As shown in FIGS. 10 and 11, the peristaltic pump may be fixed to an external wall 950 by fastening a bracket 800 to the housing 100 in the following positions: a first position wherein the bracket is parallel to the rear wall 720 of the housing 100 at the height of the lower notches 650B (FIGS. 10a, 10b and 11d); a second position wherein the bracket is parallel to the rear wall 720 of the housing 100 at the height of the upper notches 650A (FIGS. 10c, 10d and 11g); a third position wherein the bracket is parallel to the left side wall 730 of the housing 100 at the height of the lower notches 650B (FIGS. 10e, 10f and 11b); a fourth position wherein the bracket is parallel to the left side wall 730 of the housing 100 at the height of the upper notches 650A (FIGS. 10g, 10h and 11e); a fifth position wherein the bracket is parallel to the front wall 700 of the housing 100 at the height of the lower notches 650B (FIGS. 10i, 10j and 11a); a sixth position wherein the bracket is parallel to the front wall 700 of the housing 100 at the height of the upper notches 650A (FIGS. 10k and 10l); a seventh position wherein the bracket is parallel to the right side wall 710 of the housing 100 at the height of the lower notches 650B (FIGS. 10m, 10n and 11c); and an eighth position wherein the bracket is parallel to the right side wall 710 of the housing 100 at the height of the upper notches 650A (FIGS. 10o, 10p and 11f).

Moreover, it is also possible to fix the peristaltic pump to one or more external walls by fastening two or more brackets 800 to the housing 100.

Figure 12:
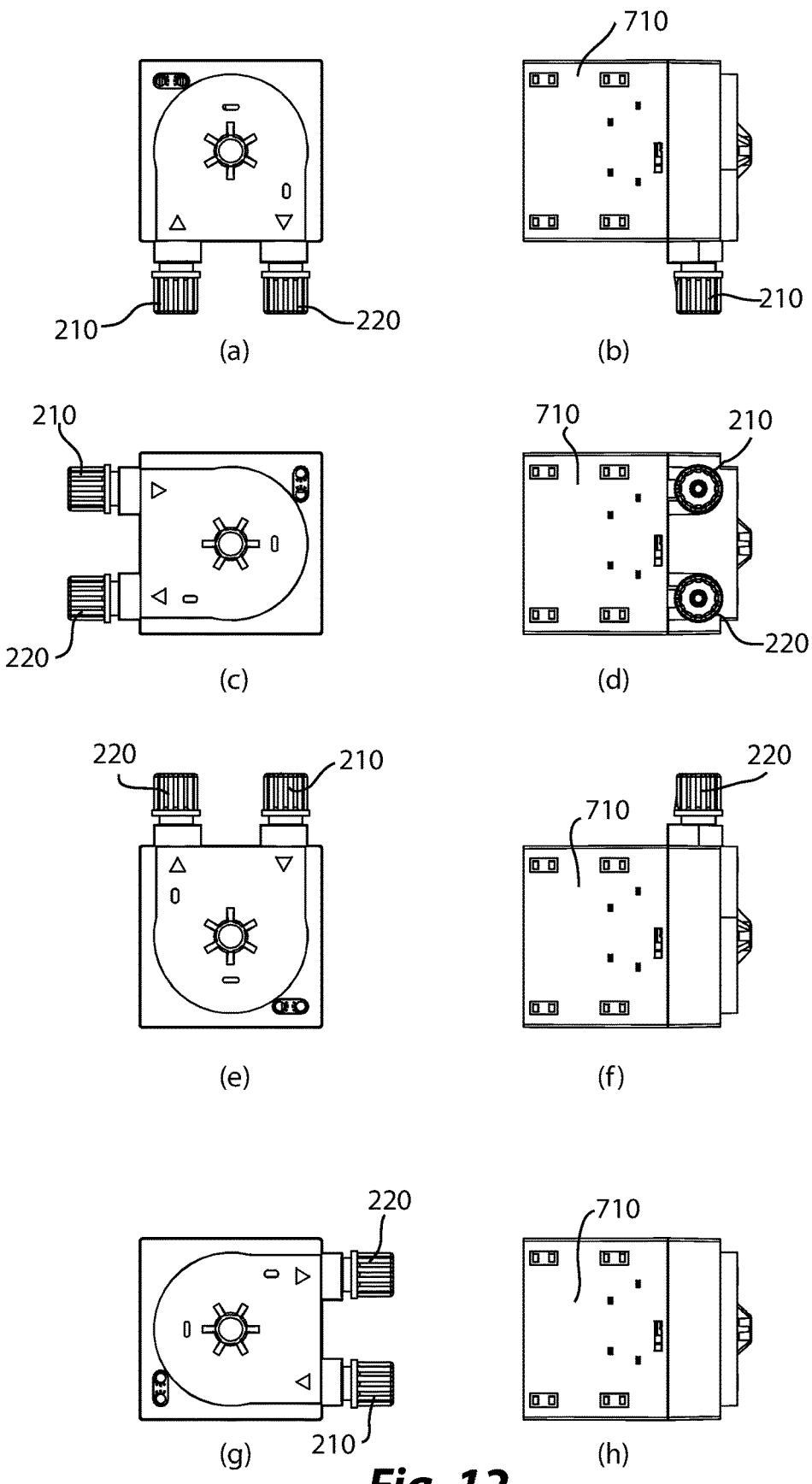
FIG. 12 shows a top plan view (FIG. 12a) and a right side view (FIG. 12b) of a first orientation of coupling of the head to the housing of the peristaltic pump of FIG. 1, a top plan view (FIG. 12c) and a right side view (FIG. 12d) of a second orientation of coupling of the head to the housing of the peristaltic pump of FIG. 1, a top plan view (FIG. 12e) and a right side view (FIG. 12f) of a third orientation of coupling of the head to the housing of the peristaltic pump of FIG. 1, and a top plan view (FIG. 12g) and a right side view (FIG. 12h) of a fourth orientation of coupling of the head to the housing of the peristaltic pump of FIG. 1.
Figure 13:
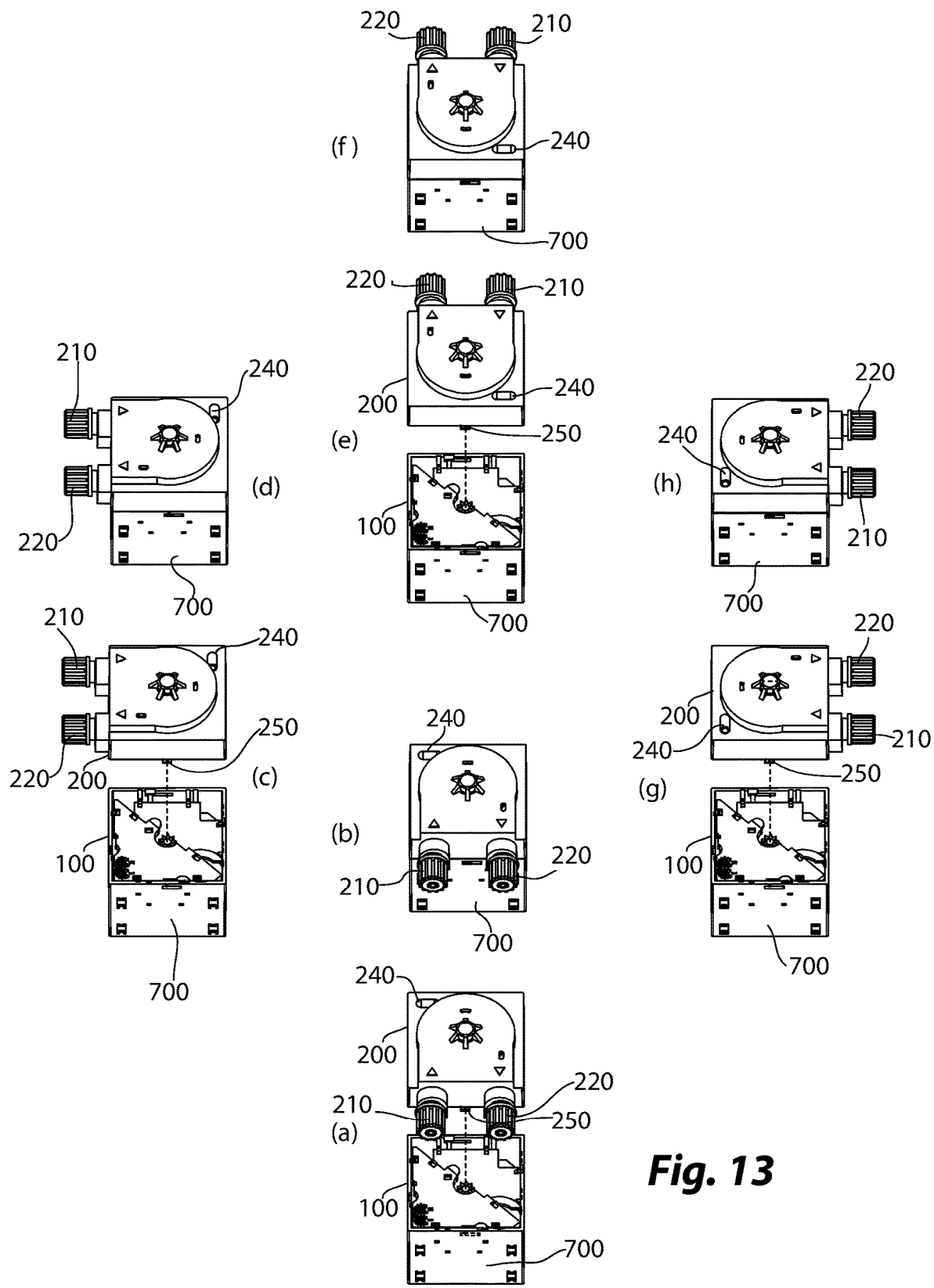
FIG. 13 shows two perspective front views of the first orientation of FIGS. 12a and 12b wherein the head and the housing are separated (FIG. 13a) and coupled (FIG. 13b), two perspective front views of the second orientation of FIGS. 12c and 12d wherein the head and the housing are separated (FIG. 13c) and coupled (FIG. 13d), two perspective front views of the third orientation of FIGS. 12e and 12f wherein the head and the housing are separated (FIG. 13e) and coupled (FIG. 13f), and two perspective front views of the fourth orientation of FIGS. 12g and 12h wherein the head and the housing are separated (FIG. 13g) and coupled (FIG. 13h)

The preferred embodiment of the peristaltic pump according to the invention shown in the Figures, having the square base of the housing 100, allows to position the head 200 by orienting the same towards any one of the four sides of the base square of the housing 100, since in each one of such positions the fourth secondary pinion 127 is configured to be mechanically connected to the hub of the rotor housed within the head 200, when the latter is coupled to the housing 100, so that the rotor is set in rotation when the electric motor is operated. Consequently, the preferred embodiment of the peristaltic pump according to the invention permits that:

the head 200 is coupled to the housing 100 so that the fourth secondary pinion 127 mechanically connects to the hub 250 of the rotor housed within the head 200, as shown in FIG. 13a, according to a first orientation wherein the first and second joints 210 and 220 protrude with respect to the front wall 700 of the housing 100, as shown in FIGS. 12a, 12b and 13b;

the head 200 is coupled to the housing 100 so that the fourth secondary pinion 127 mechanically connects to the hub 250 of the rotor housed within the head 200, as shown in FIG. 13c, according to a second orientation wherein the first and second joints 210 and 220 protrude with respect to the right side wall 710 of the housing 100, as shown in FIGS. 12c, 12d and 13d;

the head 200 is coupled to the housing 100 so that the fourth secondary pinion 127 mechanically connects to the hub 250 of the rotor housed within the head 200, as shown in FIG. 13e, according to a third orientation wherein the first and second joints 210 and 220 protrude with respect to the rear wall 720 of the housing 100, as shown in FIGS. 12e, 12f and 13f; and the head 200 is coupled to the housing 100 so that the fourth secondary pinion 127 mechanically connects to the hub 250 of the rotor housed within the head 200, as shown in FIG. 13g, according to a fourth orientation wherein the first and second joints 210 and 220 protrude with respect to the left side wall 730 of the housing 100, as shown in FIGS. 12g, 12h and 13h.

In the preferred embodiment of the peristaltic pump according to the invention, when the head 200 is coupled according to an orientation different from the first one (wherein the first and second joints 210 and 220 protrude with respect to the front wall 700 of the housing 100 as shown in FIGS. 12a, 12b and 13b), the two trimmer 163 for adjusting the speed of the electric motor are not accessible, because the slot 240 of the head 200 is not positioned above the trimmers 163 (since the printed circuit board 160 for controlling the peristaltic pump is stably coupled to the housing 100 independently from the orientation of the head 200). As a consequence, in this case it is necessary to adjust the two trimmers 163 before coupling the head 200 to the housing 100.

Other embodiments of the peristaltic pump according to the invention may comprise more than one slot for accessing the trimmers, so that these are accessible even in more than one orientation of coupling of the head to the housing that is different from the first orientation.

Further embodiments of the peristaltic pump according to the invention may have the adjusting trimmers directly coupled to the head 200 (instead of the printed circuit board), advantageously on the its top so that they are easily accessible, and they may have each adjusting trimmer that is connected to two or more respective electrical terminals (each comprising the number of wires or traces necessary to the connection with a trimmer, for instance two wires or traces) coupled to the head 200, only one of which, depending on the orientation of the head 200 with respect to the housing 100, connects to a terminal of the printed circuit board coupled to the housing 100 that corresponds to that trimmer. In this case, the trimmers are always accessible and operative for any orientation of the head 200 with respect to the housing 100.

Further embodiments of the peristaltic pump according to the invention, wherein the base of the housing is rectangular instead of square, allows the head to be coupled to the housing only according to two different orientations, unless they have a square base (or even circular) head that may be coupled to the housing in correspondence of a square shaped (or even circular) upper aperture of the same housing.

The preferred embodiments of this invention have been described and a number of variations have been suggested hereinbefore, but it should be understood that those skilled in the art can make other variations and changes without so departing from the scope of protection thereof, as defined by the attached claims.

The invention claimed is:

1. A peristaltic pump, comprising:
   a housing;
   an electric motor and a head contained by the housing, the head configured to be coupled to the housing, the head having a tube with two accessible ends; and
   a rotor provided with two or more squeezing elements configured to squeeze the tube, the rotor being configured to be driven by the electric motor when the head is coupled to the housing, wherein the housing further includes a printed circuit board configured to control the peristaltic pump and to supply power to the electric motor, the printed circuit board being provided with two slots, configured to contain two power supply terminals of the electric motor insertable into the two slots, and with two or more protruding male blade terminals, configured to be connected to external female blade terminals of an external power supply, the printed circuit board being triangular and configured to be one of a pair of printed circuit boards identical to each other obtainable by separating two antisymmetric portions of a rectangular board along a section line that is antisymmetric with respect to or coincident with a diagonal of the rectangular board, wherein the printed circuit board is coupled to the housing through snap-fit connection means, wherein the snap-fit connection means comprises snap-fit teeth with which the printed circuit board is provided which are configured to insert into corresponding slots of at least two side walls of the housing, wherein at least one side wall of the housing comprises at least one notch configured to contain two or more electrical terminals for supplying power to the printed circuit board, wherein the two or more electrical terminals contained in the at least one notch are contained in at least one duct that is in turn capable to be contained in the at least one notch, and wherein the at least one duct is hinged within the at least one notch.

2. The peristaltic pump of claim 1, wherein the rectangular board is a square board.

3. The peristaltic pump of claim 1, wherein the section line is partially arranged on the diagonal whereby the printed circuit board is provided with at least one pair of portions being offset from the diagonal, wherein a first portion of the pair is projecting with respect to the diagonal and a second portion of the pair is recessed with respect to the diagonal.

4. The peristaltic pump of claim 1, wherein the two or more protruding male blade terminals are Faston blade terminals.

5. The peristaltic pump of claim 1, wherein the printed circuit board is provided with one or more trimmers for adjusting the speed of the electric motor accessible from at least one slot of the head.

6. The peristaltic pump of claim 1, wherein the printed circuit board is provided with one or more pairs of electrical terminals configured to be connected to one or more respective trimmers for adjusting the speed of the electric motor coupled to the head and accessible from the outside.

7. The peristaltic pump of claim 1, wherein the two or more electrical terminals contained in the at least one notch are male or female terminals configured to connect to corresponding external female or male terminals for making male-female electrical connections.

8. The peristaltic pump of claim 7, wherein the two or more electrical terminals contained in the at least one notch are blade terminals.

9. A peristaltic pump, comprising:
a housing;
an electric motor and a head contained by the housing, the head configured to be coupled to the housing, the head having a tube with two accessible ends; and
a rotor provided with two or more squeezing elements configured to squeeze the tube, the rotor being configured to be driven by the electric motor when the head is coupled to the housing,
wherein the housing further includes a printed circuit board configured to control the peristaltic pump and to supply power to the electric motor, the printed circuit board being provided with two slots, configured to contain two power supply terminals of the electric motor insertable into the two slots, and with two or more protruding male blade terminals, configured to be connected to external female blade terminals of an external power supply, the printed circuit board being triangular and configured to be one of a pair of printed circuit boards identical to each other obtainable by separating two antisymmetric portions of a rectangular board along a section line that is antisymmetric with respect to or coincident with a diagonal of the rectangular board,
wherein the printed circuit board is coupled to the housing through snap-fit connection means, wherein the snap-fit connection means comprises snap-fit teeth with which the printed circuit board is provided which are configured to insert into corresponding slots of at least two side walls of the housing,
wherein the snap-fit teeth are configured to slide, while assembling the peristaltic pump, along corresponding alignment guides with which the at least two side walls of the housing are provided down to insert into the slots, whereby, while the teeth slide along the corresponding alignment guides, the printed circuit board and the at least two side walls of the housing to which the corresponding alignment guides belong elastically bend.

10. The peristaltic pump of claim 1, wherein the printed circuit board is removably coupled to the housing.

* * * * *